(12) United States Patent
Chobot

(10) Patent No.: US 8,680,884 B2
(45) Date of Patent: Mar. 25, 2014

(54) FAULT DETECTION CIRCUITS FOR SWITCHED MODE POWER SUPPLIES AND RELATED METHODS OF OPERATION

(75) Inventor: Joseph Paul Chobot, Morrisville, NC (US)

(73) Assignee: Cree, Inc., Durham, NC (US)

( * ) Notice: Subject to any disclaimer, the term of this patent is extended or adjusted under 35 U.S.C. 154(b) by 631 days.

(21) Appl. No.: 12/756,573

(22) Filed: Apr. 8, 2010

(65) Prior Publication Data

US 2011/0234255 A1 Sep. 29, 2011

Related U.S. Application Data

(60) Provisional application No. 61/317,486, filed on Mar. 25, 2010.

(51) Int. Cl.
*G01R 31/40* (2006.01)

(52) U.S. Cl.
USPC ...... 324/764.01; 324/555; 324/523; 324/750; 324/531; 324/532; 323/284; 323/285; 323/271; 361/18; 361/93.1; 363/50; 363/74; 327/26

(58) Field of Classification Search
USPC .............. 324/555, 771, 750.01, 764.01, 531, 324/532, 523; 327/56, 58, 62, 74, 26; 323/284, 285, 271; 361/18, 118, 93.1; 363/50, 74; 340/517, 525, 661
See application file for complete search history.

(56) References Cited

U.S. PATENT DOCUMENTS

| 4,270,164 | A | * | 5/1981 | Wyman et al. | 363/56.03 |
|---|---|---|---|---|---|
| 5,122,726 | A | * | 6/1992 | Elliott et al. | 323/272 |
| 5,315,256 | A | * | 5/1994 | Schuyler | 324/511 |
| 5,525,913 | A | * | 6/1996 | Brooks et al. | 324/756.02 |
| 5,754,036 | A | | 5/1998 | Walker | |
| 5,861,735 | A | * | 1/1999 | Uchida | 323/271 |
| 5,995,001 | A | * | 11/1999 | Wellman et al. | 340/438 |
| 6,092,992 | A | | 7/2000 | Imblum et al. | |
| 6,191,569 | B1 | | 2/2001 | Arbetter et al. | |
| 6,853,174 | B1 | * | 2/2005 | Inn | 323/285 |
| 7,449,912 | B2 | * | 11/2008 | Pracht et al. | 324/764.01 |
| 7,595,615 | B2 | | 9/2009 | Li et al. | |
| 7,881,027 | B2 | * | 2/2011 | Balakrishnan et al. | 361/18 |

(Continued)

OTHER PUBLICATIONS

International Search Report and the Written Opinion of the International Searching Authority corresponding to International Application No. PCT/US2011/027892; Date of Mailing: May 4, 2011; 10 Pages.

(Continued)

*Primary Examiner* — Tung X Nguyen
*Assistant Examiner* — Thang Le
(74) *Attorney, Agent, or Firm* — Myers Bigel Sibley & Sajovec, PA

(57) ABSTRACT

A circuit for detecting fault conditions in a supply circuit includes a monitoring circuit and a comparator circuit. The monitoring circuit is operable to output a detection signal related to a control signal for the switched mode power supply. The control signal may be configured to operate at least one switch of the supply circuit between alternating activated and deactivated states to supply power to a load. The comparator circuit is operable to compare the detection signal to a range defined by first and second thresholds and output a fault signal according to a relationship of the detection signal to the range over a time period. Related methods of operation are also discussed.

28 Claims, 5 Drawing Sheets

(56) References Cited

U.S. PATENT DOCUMENTS

| | | | |
|---|---|---|---|
| 8,093,878 B2 * | 1/2012 | Goto et al. | 323/285 |
| 2001/0009517 A1 * | 7/2001 | Preller | 363/21.04 |
| 2004/0189348 A1 * | 9/2004 | Tallant, II | 327/26 |
| 2005/0285619 A1 * | 12/2005 | Williams | 324/771 |
| 2006/0279970 A1 | 12/2006 | Kernahan | |
| 2007/0153439 A1 * | 7/2007 | Matyas | 361/90 |
| 2007/0200610 A1 | 8/2007 | Bailly | |
| 2008/0046204 A1 | 2/2008 | Jungreis | |
| 2010/0085024 A1 * | 4/2010 | Houston et al. | 323/281 |
| 2010/0110738 A1 * | 5/2010 | Shimizu | 363/124 |
| 2012/0206842 A1 * | 8/2012 | Balakrishnan et al. | 361/18 |

OTHER PUBLICATIONS

International Preliminary Report on Patentability Corresponding to International Application No. PCT/US2011/027892; Date of Mailing: Oct. 4, 2012; 8 Pages.

* cited by examiner

FAULT DETECTION CIRCUITS FOR SWITCHED MODE POWER SUPPLIES AND RELATED METHODS OF OPERATION

CLAIM OF PRIORITY

The present application claims priority from U.S. Provisional Patent Application Ser. No. 61/317,486, filed Mar. 25, 2010, the disclosure of which is hereby incorporated by reference herein in its entirety.

FIELD OF THE INVENTION

The present invention relates to power conversion and, more particularly, to power supply circuits and related methods of operation.

BACKGROUND

Power converter circuits may be used to convey power from a source, such as a battery, electrical power grid, etc. to a load, such as any device, apparatus, or component that runs on electricity, preferably with as little loss as possible. Generally, a power converter circuit provides an output voltage that has a different level than the input voltage. One type of power converter circuit is known as a switching or switched mode power supply. A switched mode power supply controls the flow of power from a power source to a load by controlling the "on" and "off" duty cycle of one or more transistor switches in order to regulate the DC output voltage across the output terminals of the power supply. The "on" and "off" duty cycle of the one or more transistor switches may be controlled in response to a pulse-width-modulated (PWM) gate drive signal provided by a switching regulator circuit, such that the "on" and "off" duty cycle of the one or more transistor switches is determined by relative pulse-widths of the PWM signal.

Some switched mode power supplies may use a transformer or an inductor as an energy transfer element. A power transistor may be coupled to one side of the primary winding of a transformer, and may be turned on and off in response to the gate drive signal provided by the switching regulator circuit to alternately store energy in the magnetic field of the transformer and transfer the stored energy to the secondary winding. The secondary winding of the transformer may develop a rectified output voltage across a shunt capacitor coupled across the secondary winding as a function of the energy transfer. The voltage across the capacitor may provide the DC output voltage of the switching power supply. The DC output voltage, or a representation thereof, may be fed back to the switching regulator circuit to allow the switched mode power supply to compensate for load variation. As the load increases, the DC output voltage decreases, which may cause the switching regulator to alter the gate drive signal to leave the power transistor "on" for a longer average period of time in order to store more energy in the magnetic field. The additional energy may be transferred to the secondary winding during the "off" time of the power transistor to supply the increased load and re-establish the DC output voltage. As the load decreases, the DC output voltage increases, which may cause the switching regulator to alter the gate drive signal to leave the power transistor "on" for a shorter average period of time to store less energy in the magnetic field. The reduced energy transfer to the secondary winding during the "off" time of the power transistor may cause the power supply to adjust to the decreased load and may reduce the DC output voltage back to its steady-state value.

Switched mode power supplies have been implemented as an efficient mechanism for providing a regulated output, and are generally more power efficient than linear voltage regulators, which dissipate unwanted power as heat. However, many switched mode power supplies may not be able to detect overload or fault conditions. Examples of possible faults may include a short-circuit or open-circuit at the output of the power supply, broken or unpopulated magnetic components, and/or loss of power to be converted at the input of the power supply.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

According to some embodiments of the present invention, a circuit for detecting fault conditions in a supply circuit includes a monitoring circuit and a comparator circuit. The monitoring circuit is operable to output a detection signal related to a characteristic of a control signal for the supply circuit. The comparator circuit is operable to compare the detection signal to a range defined by first and second thresholds and output a fault signal according to a relationship of the detection signal to the range over a time period.

In some embodiments, the supply circuit may be a switched mode power supply, and the control signal may be configured to operate at least one switch of the supply circuit between alternating activated and deactivated states, for example, to provide power to a load. The detection signal may be indicative of a characteristic of the control signal.

In some embodiments, the characteristic of the control signal may be a duty cycle of the control signal, the first threshold may represent an upper limit for the duty cycle, and the second threshold may represent a lower limit for the duty cycle. In other embodiments, the characteristic of the control signal may be a frequency of the control signal, the first threshold may represent an upper limit for the frequency, and the second threshold may represent a lower limit for the frequency. The comparator may be operable to output the fault signal when the detection signal is not within the range defined between the first and second thresholds for the time period.

In some embodiments, the at least one switch may be a power transistor, and the control signal may be a gate drive signal for the power transistor. The monitoring circuit may include an averaging circuit that is operable to receive the gate drive signal, determine an average value representing the gate drive signal based on the duty cycle thereof, and output the average value to the comparator circuit as the detection signal indicative of the duty cycle.

In some embodiments, the first threshold may be an average value representing the gate drive signal at a maximum duty cycle, and the second threshold may be an average value representing the gate drive signal at a minimum duty cycle.

In some embodiments, the circuit may further include a logic circuit that is operable to receive respective gate drive signals from a plurality of switched mode power supply controllers. The logic circuit may be operable to output a first signal representing one of the respective gate drive signals having a longest duty cycle and a second signal representing one of the respective gate drive signals having a shortest duty cycle to the averaging circuit. The averaging circuit may be operable to output a first average value representing the one of the respective gate drive signals having the longest duty cycle and a second average value representing the one of the respective gate drive signals having the shortest duty cycle. The comparator circuit may be operable to compare the first average value to the first threshold, to compare the second average value to the second threshold, and to output the fault signal when the first average value is greater than or equal to the first threshold and/or when the second average value is less than or equal to the second threshold.

In some embodiments, the comparator circuit may include first and second comparators. The first comparator may be operable to compare the detection signal indicative of the duty cycle of the control signal to the first threshold and output the fault signal when the detection signal is greater than or equal to the first threshold. The second comparator may be operable to compare the detection signal indicative of the duty cycle of the control signal to the second threshold an output the fault signal when the detection signal is less than or equal to the second threshold.

In some embodiments, the fault signal may include a first fault signal indicating an open-circuit condition and a second fault signal indicating a short-circuit condition. The first comparator may be operable to output the first fault signal when the detection signal indicative of the duty cycle is greater than or equal to the first threshold, and the second comparator may be operable to output the second fault signal when the detection signal indicative of the duty cycle is less than or equal to the second threshold.

In some embodiments, the comparator circuit may be operable to output a power-good signal indicating that no fault conditions exist when the detection signal indicative of the duty cycle is less than the first threshold and is greater than the second threshold.

In some embodiments, the monitoring circuit may be operable to output the detection signal responsive to receiving the control signal from a controller of the supply circuit. In other embodiments, the monitoring circuit may be operable to output the detection signal responsive to a feedback signal from a load connected to the supply circuit.

In some embodiments, the circuit may further include a decoupling circuit operable to decouple the supply circuit from a power source in response to the fault signal.

According to further embodiments of the present invention, a method of detecting fault conditions in a supply circuit includes generating a detection signal related to a control signal for the supply circuit. The detection signal is compared to a range defined by first and second thresholds, and a fault signal is provided when the detection signal is not within the range defined by the first and second thresholds for a period of time.

In some embodiments, the supply circuit may be a switched mode power supply, and the control signal may be configured to drive at least one switching element of the supply circuit between alternating activated and deactivated states to supply power to a load. The detection signal may be indicative of a characteristic of the control signal.

In some embodiments, the characteristic of the control signal may be a duty cycle of a control signal, an amplitude of the control signal and/or a frequency of the control signal.

In some embodiments, the detection signal may indicate a sampled value for the characteristic, an average value for the characteristic, and/or a rate of change for the characteristic, and the range may be an operating range for the characteristic.

In some embodiments, the at least one switching element may be a power transistor, the control signal may be a gate drive signal for the power transistor, and the characteristic of the control signal may be a duty cycle of the gate drive signal.

In some embodiments, an average value representing the gate drive signal may be determined based on the duty cycle of the gate drive signal. The average value may be output as the detection signal indicative of the duty cycle of the gate drive signal, and the average value may be compared to the first and second thresholds. The first threshold may be an average value representing the gate drive signal at an upper limit of the duty cycle, and the second threshold may be an average value representing the gate drive signal at a lower limit of the duty cycle.

In some embodiments, providing the fault signal may include providing a first fault signal indicating an open-circuit condition when the detection signal indicative of the duty cycle of the gate drive signal is greater than or equal to the first threshold, and providing a second fault signal indicating a short-circuit condition when the detection signal indicative of the duty cycle of the gate drive signal is less than or equal to the second threshold.

In some embodiments, a power-good signal indicating that no fault conditions exist may be provided when the detection signal indicative of the duty cycle is less than the first threshold and is greater than the second threshold.

In some embodiments, a feedback signal may be received from a load connected to the supply circuit, and the detection signal may be generated responsive to receiving the feedback signal.

According to still further embodiments of the present invention, a switched mode power supply includes at least one switching element operable to be switched between alternating activated and deactivated states to supply power to a load, and a controller circuit operable to output a control signal to the at least one switching element. The control signal is configured to drive the at least one switching element between the alternating activated and deactivated states. The switched mode power supply further includes a first circuit and a second circuit. The first circuit is coupled to the controller and is operable to output a signal indicative of a duty cycle of the control signal. The second circuit is coupled to the first circuit and is operable to compare the signal indicative of the duty cycle of the control signal to a range defined by first and second thresholds. The second circuit is further operable to output a fault signal when the signal indicative of the duty cycle of the control signal falls outside of the range defined by the first and second thresholds for a predetermined amount of time.

Although described above primarily with respect to method, circuit, and power supply aspects, it will be understood that the present invention may be embodied as other methods, circuits, and/or electronic devices, and that such embodiments will be or become apparent to one with skill in the art upon review of the following drawings and detailed description. It is intended that all such additional methods, circuits, and/or electronic devices, as well as any combinations of the above embodiments, be included within this description and be protected by the accompanying claims.

DETAILED DESCRIPTION

Figure 1:
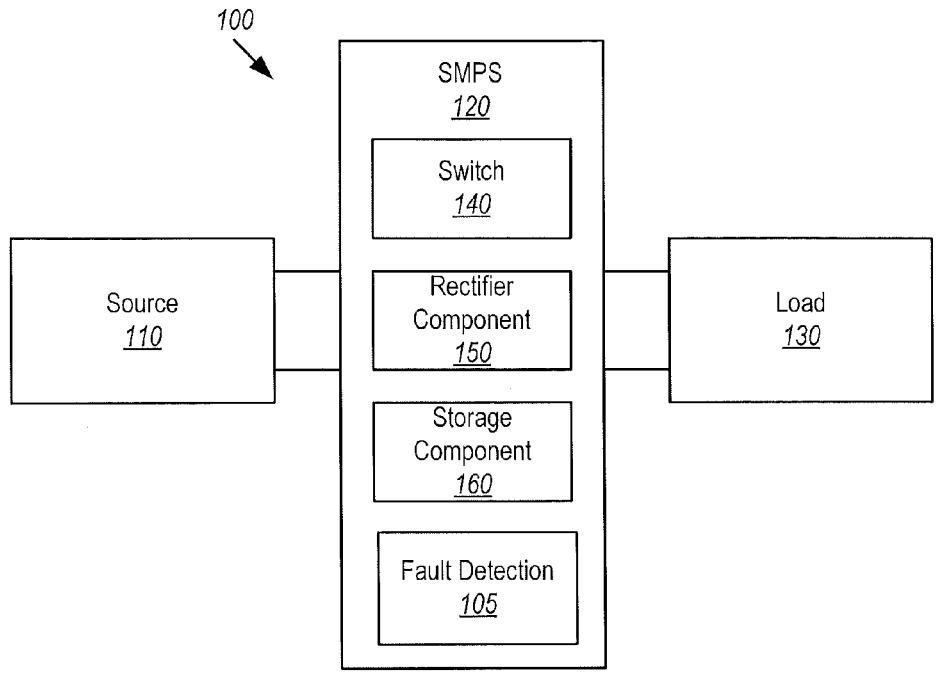
FIG. 1 is a block diagram illustrating a power converter circuit including a fault detection circuit according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Likewise, when operations are performed "in response to" or "responsive to" a signal, the operations may be performed in direct response to the signal or in response to one or more intervening signals; in contrast, when operations are performed "in direct response to" or "directly responsive to" a signal, the operations are not performed in response to intervening signals.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

In many switched mode power applications, it may be useful to provide fault indication to an outside monitor. Some embodiments of the present invention arise from realization that, while switched mode power supply controllers may not typically be designed to detect fault conditions, characteristics of a control signal of a switching device of the power supply, such as, for example, the duty cycle of the gate drive signal, may change when certain types of faults occur.

Accordingly, embodiments of the present invention monitor one or more characteristics or parameters of a control signal of a switching element in a switched mode power supply to detect faults in the switched mode power supply. The characteristic(s) of the control signal may be directly or indirectly measured. A range and/or threshold may be established for the measure of the control signal and a fault detected based on a relationship of the measure and the range and/or threshold. The range and/or threshold may reflect normal operation or the range and/or the threshold may reflect a fault in the power supply. Thus, for example, if a range reflects normal operation and the measure is within the range, then no fault is detected. If the measure falls outside of the range, then a fault is detected. A fault signal or a no-fault/good signal may be generated based on the relationship of the measure of the characteristic of the control signal and the range and/or threshold. The measure of the control signal may be an analog or digital value and may be continuous or discrete. The characteristic of the control signal that is measured may depend on the specific design of the switched mode power supply. In some embodiments, the characteristic may be the duty cycle of a control signal, an amplitude of a control signal and/or a frequency of a control signal. Likewise, the measure may be a sampled value for the characteristic, an average value for the characteristic, a rate of change for the characteristic, a convolution with the characteristic, or combinations thereof.

FIG. 1 is a block diagram illustrating a power converter circuit 100 including a fault detection circuit 105 according to some embodiments of the present invention. Referring now to FIG. 1, the power converter circuit 100 includes a supply circuit, shown as switched mode power supply (SMPS) 120, that connects a power source 110 to a load 130. The power source 110 may be an Alternating Current (AC) or a Direct Current (DC) power source. As shown in FIG. 1, the SMPS 120 includes a switching element or switch 140, a rectifier component 150, a storage component 160, and a fault detection component 105. The load 130 may be any apparatus or device that receives the output voltage/current generated by the SMPS 120 responsive to an input voltage/current received from the power source 110. In accordance with various embodiments, the storage component 160 may include a magnetic field storage component (such as an inductor and/or a transformer) and/or an electric field storage component (such as a capacitor). The SMPS 120 may, in some embodiments, be a DC to DC power converter. The DC to DC power converter circuit may be configured in, for example but not limited to, a buck configuration, a boost configuration, and a buck-boost configuration. However, the SMPS 120 may be an AC to DC, AC to AC, or DC to AC power converter in other embodiments. Also, although illustrated as included in the SMPS 120, it will be understood that the fault detection component 105 may be separate from and/or external to the SMPS 120 in some embodiments.

Figure 2:
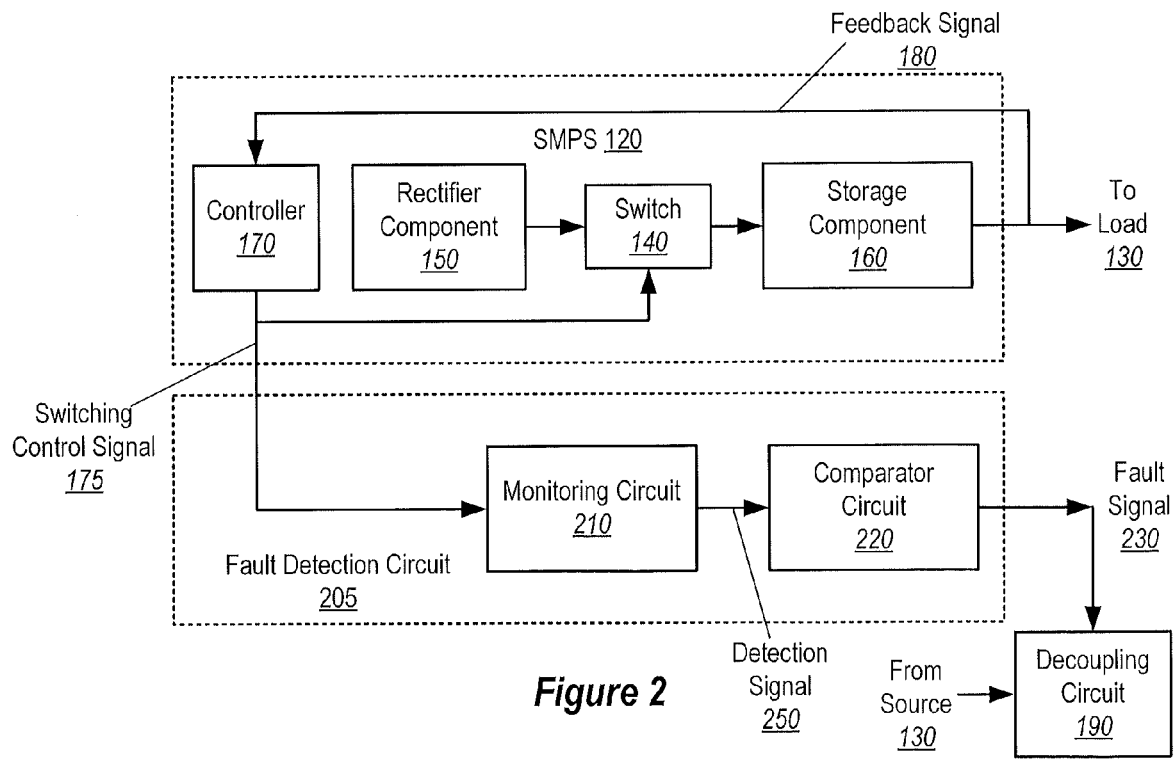
FIG. 2 is a block diagram illustrating the fault detection circuit of FIG. 1 in greater detail.

Operations of the power converter circuit 100, according to some embodiments of the present invention, will now be described. The switch 140 may be operable to provide alternating activated and deactivated states, such as closed and open states, on and off states, etc., to supply power to the load 130. The rectifier component 150 may be biased in at least two operational states, such as forward or reverse biased. When the switch 140 is in the "on" or "closed" operational state, the rectifier component 150 is in a first bias state and energy from the power source 110 is stored in the storage component 160. When the switch 140 transitions to the "off" or "open" operational state, the rectifier component 150 is in a second bias state and the energy stored in the storage component 160 is released to the load 130. The voltage/current delivered to the load 130 may be regulated based on the duty cycle of a control signal for the switch 140, and a feedback control loop may be used to regulate the energy output to the load 130 by varying the duty cycle of a control signal for the switch 140 to compensate for variations in the load 130. The fault detection circuit 105 may be operated based on the control signal for the switch 140, as described in detail below FIG. 2 is a block diagram further illustrating the fault detection circuit 105 according to some embodiments of the present invention. Referring now to FIG. 2, the fault detection circuit 105 includes a monitoring circuit 210 and a comparator circuit 220. The monitoring circuit 210 receives a switching control signal 175 output by a switching controller or switching regulator 170 of the SMPS 120, determines one or more characteristics or parameters of the switching control signal 175, and outputs a detection signal 250 indicative of the determined characteristic(s) of the switching control signal 175. As noted above, the switching control signal 175 is configured to operate the switch 140 of the SMPS 120 between alternating activated and deactivated states to supply power to the load 130. The switching controller 170 is operable to vary one or more characteristics or parameters of the switching control signal 175 in response to a feedback signal 180 to compensate for variations in the load 130 so as to provide a constant output voltage.

As shown in FIG. 2, the comparator circuit 220 receives the signal 250 output by the monitoring circuit 210, and is operable to compare the signal 250 indicative of the characteristic (s) of the switching control signal 175 to first and second thresholds and output a fault signal 230 (indicating a fault condition) when the signal 250 is not within a range defined between the first and second thresholds for a predetermined time period. An indicator light, such as a light emitting diode (LED) or other a solid state lighting element (not shown), may be illuminated in response to the fault signal 230 to indicate the presence of the fault condition to a user. Additionally or alternatively, a decoupling circuit 190 may be operable to decouple the SMPS 120 from the power source 110 in response to the fault signal 230.

In some embodiments, the characteristic indicated by the signal 250 may be a duty cycle of the control signal 175. The duty cycle of the control signal 175 refers to the ratio of the time that the control signal 175 has an active "high" value or state (also referred to herein as the "on-time") relative to a period of the control signal 175. For example, in embodiments where the SMPS 120 utilizes one or more power transistors (such as field effect transistor (FETs)) as the switching device 140, the control signal 175 may be a pulse-width-modulated (PWM) gate drive signal that is operable to drive the power transistor(s) of the SMPS 120 between the alternating activated and deactivated states to supply power to the load 130 based on its duty cycle. For such a PWM gate drive signal, the duty cycle may be defined as $D=T_{on}/T$, where $T_{on}$ is the pulse duration (e.g., the "on-time"), and T is the period of the signal.

Figure 3A:
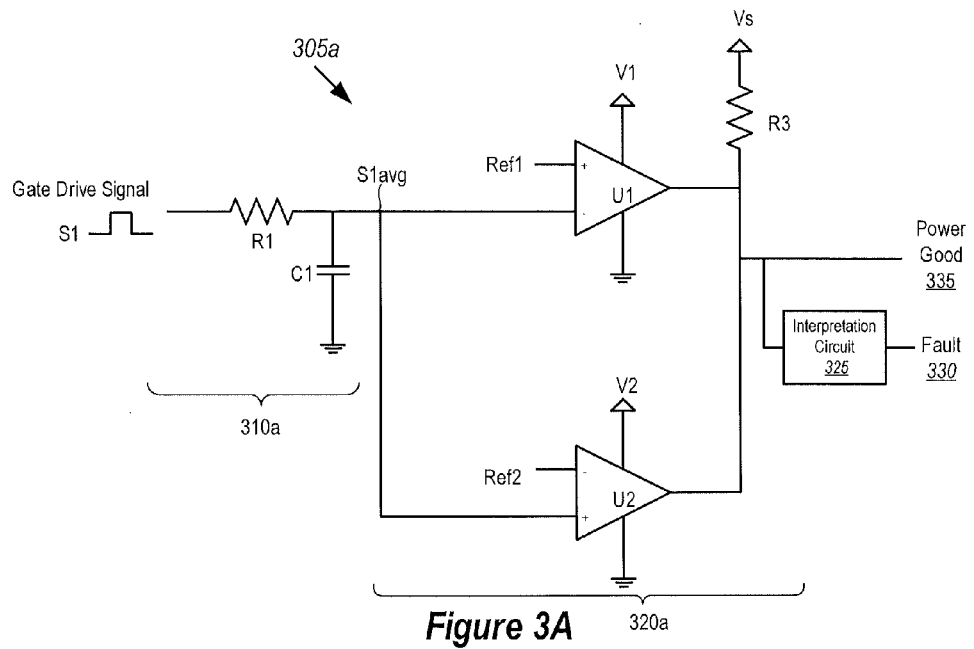
FIGS. 3A and 3B are schematic diagrams illustrating fault detection circuits according to some embodiments of the present invention.
Figure 3B:
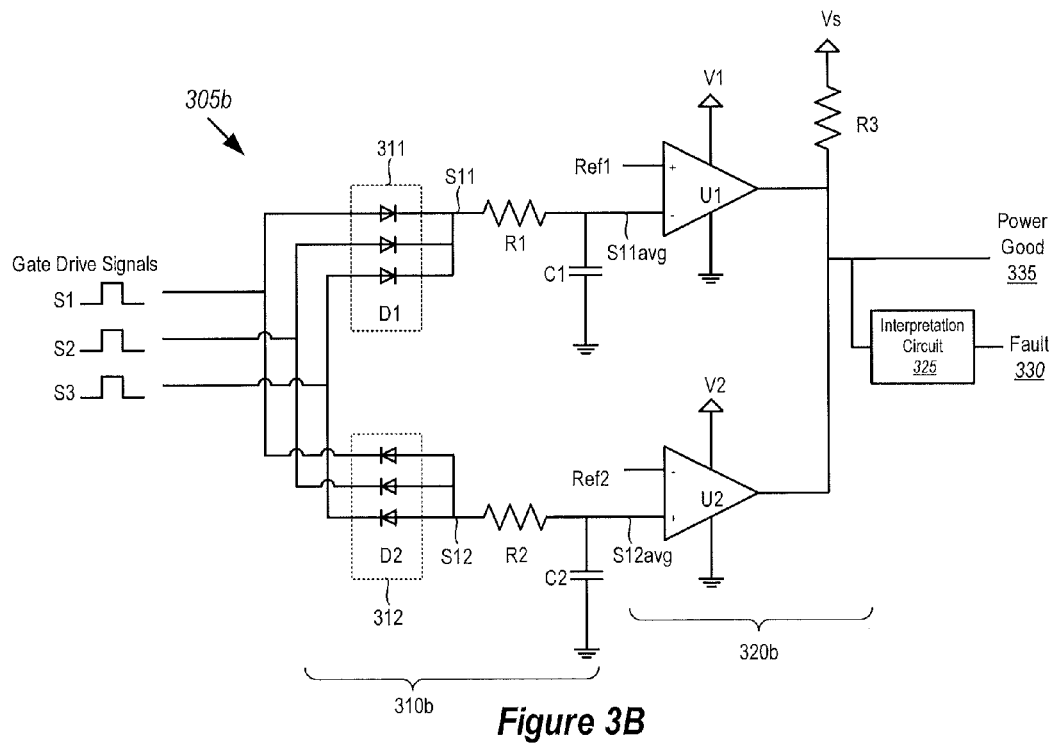

According to some embodiments of the present invention, the duty cycle of the gate drive signal may be monitored to determine information about the status of the switched mode power supply (SMPS). FIGS. 3A and 3B are schematic diagrams illustrating example fault detection circuits 305a and 305b according to some embodiments of the present invention that are operable to detect certain SMPS faults and provide a "Power Good" (PGOOD) signal 335 when no faults are detected. In particular, as described in detail below, the fault detection circuits 305a and 305b compare the duty cycle of the gate drive signal output by an SMPS controller (such as the controller 170 of FIG. 2) to two reference or threshold values, one based on a maximum duty cycle of the gate drive signal or other upper limit associated therewith, and another based on a minimum duty cycle of the gate drive signal or other lower limit associated therewith, to define an operating range for the duty cycle of the gate drive signal. In particular embodiments, the maximum gate drive duty cycle may be about 90% or more, while the minimum gate drive duty cycle may be about 40% or less. As such the operating range for the gate drive duty cycle may be between about 40% and about 90%, while a "normal" gate drive duty cycle may be about 50% to about 70% in some embodiments. If the duty cycle of the gate drive signal decreases, it may be determined that the controller 170 is attempting to decrease its output. Likewise, if the duty cycle of the gate drive signal increases, it may be determined that the controller 170 is attempting to increase its output.

Accordingly, in some embodiments of the present invention, if the gate drive duty cycle remains outside of the range defined between the first and second threshold values (e.g., remains substantially equal to or above the first threshold value or remains substantially equal to or below the second threshold value) for a predetermined amount or period of time, the fault detection circuit may determine that a fault has occurred, and that the controller is unable to recover and resume regulation on its own. The predetermined time period may be selected based on the period of the gate drive signal and/or the type of fault to be detected, and may be equal to zero in some embodiments. For example, for a PWM gate drive signal having a period of about 5 microseconds, a fault may be detected within about 1 second. The predetermined time period may be provided based on a delay or time constant provided by components of a monitoring or filtering circuit, and/or using a counter in some embodiments.

Example operations of the fault detection circuits 305a and 305b according to some embodiments of the present invention will now be described. Referring to FIG. 3A, the fault detection circuit 305a includes a monitoring stage 310a and a comparator stage 320a. The monitoring stage 310a includes a resistor R1 and a capacitor C1 that are used to monitor a gate drive signal S1 output from a single SMPS controller or regulator, such as the switching controller 170 of FIG. 1. The resistor R1 and capacitor C1 provide an averaging circuit that translates the duty cycle of the gate drive signal S1 to an average DC value. In particular, the PWM gate drive signal S1 produced by the switching controller 170 is filtered by the averaging circuit to generate an average signal $S1_{avg}$ representing a time average voltage of the gate drive signal S1. While the averaging circuit is illustrated as a low-pass filter that includes resistor R1 and capacitor C1, it will be appreciated that other types of filter circuits may be used for the averaging circuit, and that components of such filter circuits may be selected to provide a desired time constant.

Still referring to FIG. 3A, the comparator stage 320a includes first and second open-collector output comparators U1 and U2, which together provide a window comparator. As will be appreciated, in a comparator having an open-collector output stage, the collector terminal of the output transistor is connected to a power supply voltage through a pull-up resistor, such as resistor R3. When a voltage applied to the non-inverting input (+) is greater than a voltage applied to the inverting input (−), the output of the comparator is held at a high impedance state, and when the voltage applied to the non-inverting input (+) is less than a voltage applied to the inverting input (−), the output of the comparator is held at ground. In FIG. 3A, a first reference voltage Ref1, which represents an average value of the gate drive signal S1 at its maximum duty cycle (or other upper limit), is applied to the non-inverting input (+) of the first comparator U1, while a second reference voltage Ref2, which represents an average value of the gate drive signal S1 at its minimum duty cycle (or other lower limit), is applied to the inverting input (−) of the second comparator U2. As noted above, the maximum duty cycle may be about 90% and the minimum duty cycle may be about 40% in some embodiments.

Accordingly, during normal operation (e.g., when the SMPS is correctly regulating its output), the duty cycle of the gate drive signal S1 remains within a predetermined operating range, e.g., between a maximum duty cycle and a minimum duty cycle. As such, the DC value of the average signal $S1_{avg}$ across capacitor C1 remains below the first reference value Ref1 and above the second reference value Ref2, leaving the outputs of both comparators U1 and U2 open and the PGOOD signal 335 held "high" (e.g., at the supply voltage Vs) by pull-up resistor R3, indicating that no fault conditions are present, for example, by illuminating an indicator light. If a fault occurs, for example, where the load is shorted or removed, the switching controller 170 is configured to increase or decrease the duty cycle of the gate drive signal S1 in an attempt to maintain output regulation. The DC value of the average signal $S1_{avg}$ across capacitor C1 thereby either decreases to (or becomes lower than) the lower limit indicated by Ref 2, or increases to (or becomes greater than) the upper limit indicated by Ref1. When such an increase or decrease is detected by either U1 or U2, the PGOOD signal 335 is pulled to ground.

The PGOOD signal 335 may be provided to an interpretation circuit 325, which provides a fault signal 330 in response to the "low" value of the PGOOD signal 335 and/or other conditions. For example, the PGOOD signal 335 may be used to enable counter and a comparator (not shown) such that. when the PGOOD signal is pulled to ground for a predetermined time period (as determined by the counter and comparator), the fault signal 330 is provided. The interpretation circuit 325 may also be communicatively coupled to the controller 170 to avoid false fault detection. For example, when the controller 170 alters the duty cycle and/or does not output the gate drive signal in response to a valid user command (such as a "PWM dim" command), the controller 170 may provide an indication to the interpretation circuit 325 such that the fault signal 330 is not output even if the PGOOD signal 335 is held low for the predetermined time period.

Referring now to FIG. 3B, another example fault detection circuit 305b includes a monitoring stage 310b and a comparator stage 320b. The comparator stage 320b may operate in a manner similar to that of the comparator stage 320a described above with reference to FIG. 3A. However, the monitoring stage 310b is used to simultaneously monitor the duty cycles of a plurality of gate drive signals S1, S2, and S3 respectively output from three SMPS switching regulators. The gate drive signals S1, S2, and S3 from each regulator are provided to a first logic circuit 311 (illustrated as a diode-based OR gate D1) to output the gate drive signal having the longest on-time as signal S11, and are provided to a second logic circuit 312 (illustrated as a diode-based AND gate D2) to output the gate drive signal having the shortest on-time as signal S12. Although illustrated with reference to diode-based OR gates D1 and AND gates D2, the logic circuits 311 and 312 may be implemented using a software algorithm in a microcontroller and/or other types of logic circuitry. In the example of FIG. 3B, all three switching regulators use the same clock source, so that the outputs of the OR gates D1 and AND gates D2 represent the correct duty cycles.

Figure 3C:
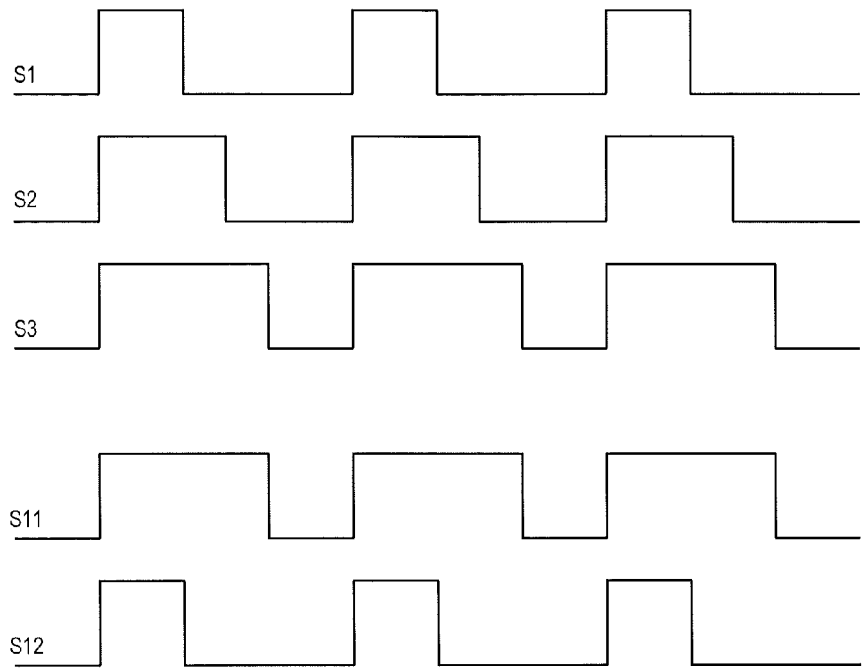
FIG. 3C is a timing diagram illustrating the relative on-times for the gate drive signals illustrated in FIG. 3B.

FIG. 3C is a timing diagram illustrating the relative on-times of the gate drive signals S1, S2, and S3, as well as the outputs S11 and S12 of the logic circuits 311 and 312, respectively, of FIG. 3B. As shown in FIG. 3C, gate drive signal S1 has the shortest duty cycle, while gate drive signal S3 has the longest duty cycle. As such, the signal S11 output from the OR-gates D1 represents gate drive signal S3, while the signal S12 output from the AND-gates D2 represents gate drive signal S1.

Referring again to FIG. 3B, the monitoring stage 310b further includes a first averaging circuit (illustrated as an RC filter including resistor R1 and capacitor C1) and a second averaging circuit (illustrated as an RC filter including resistor R2 and capacitor C2). Accordingly, the signal S11 output from the diode-OR gates D1 is RC-filtered via resistor R1 and capacitor C1 to generate an average signal $S11_{avg}$ representing the average DC value of the gate drive signal S3 having the longest on-time, while the signal S12 output from the diode-AND gate is RC-filtered via resistor R2 and capacitor C2 to generate an average signal $S12_{avg}$ representing the average DC value of the gate drive signal S1 having the shortest on-time. The average signals $S11_{avg}$ and $S11_{avg}$ are provided to the first and second comparators U1 and U2 of the comparator stage 320b, respectively, which operate in a manner similar to that described above with reference to FIG. 3A to output the PGOOD signal 335 (which is held high by pull-up resistor R3) when the gate drive signals S1, S2, and S3 are within the range defined by the first and second reference values Ref1 and Ref2, indicating that no fault conditions exist.

However, if a fault occurs at even one of the monitored switched mode power supplies, the corresponding one of the switching controllers is configured to increase or decrease the duty cycle of its gate drive signal in an attempt to maintain output regulation. Accordingly, if the duty cycle of one of the gate drive signals S1, S2, or S3 is increased relative to the others, the gate drive signal having the increased duty cycle will be output by logic circuit 311, averaged by resistor R1 and capacitor C1, and compared to the upper limit Ref1 by comparator U1. Conversely, if the duty cycle of one of the gate drive signals S1, S2, or S3 is decreased relative to the others, the gate drive signal having the decreased duty cycle will be output by logic circuit 312, averaged by resistor R2 and capacitor C2, and compared to the lower limit Ref2 by comparator U2. When such an increase or decrease is detected by either U1 or U2, the PGOOD signal 335 is pulled to ground. When the PGOOD signal is pulled to ground for a predetermined time period (and/or when other conditions indicating a fault are present), a fault signal 330 is provided.

As discussed above, when a fault is detected, the PGOOD signal 335 is no longer output by the fault detection circuits 305a and 305b. The PGOOD signal 335 may thereby be monitored and used, for example, to signal information to a user (e.g., by illuminating an indicator light), as an input to another device and/or processor, and/or to shut off or decouple the SMPS 120 from a power source. Examples of faults that may be detected by embodiments of the present invention include a short-circuit or open-circuit at the output of the power supply, broken or unpopulated magnetic components, and/or loss of power at the input of the power supply. More generally, fault detection circuits according to embodiments of the present invention may be used to detect faults at the input, output, and/or anywhere in-between in a switched mode power supply.

In addition, in some embodiments, the comparator stages 320a and/or 320b may be operable to output different fault signals that indicate the particular type of fault condition. For example, as a gate drive signal having a maximum duty cycle for a prolonged period may indicate an open-circuit, the first comparator U1 may be operable to output a first fault signal indicating an open-circuit condition when the signal $S1_{avg}$ (or $S11_{avg}$) is greater than or substantially equal to the first threshold Ref1 for the predetermined amount of time. Likewise, as a gate drive signal having a minimum duty cycle for a prolonged period may indicate an short-circuit, the second comparator U2 may be operable to output a second fault signal indicating a short-circuit condition when the signal $S1_{avg}$ (or $S12_{avg}$) is less than or substantially equal to the second threshold Ref2 for the predetermined amount of time. Separate indicator lights may be provided for open-circuit and short-circuit conditions, and may be illuminated in response to the first and second fault signals, respectively. Also, in some embodiments, a delay may be introduced in the operation of the fault detection circuits 305a and/or 305b to avoid false fault detection in the absence of a switching signal, for example, upon initialization of the SMPS.

Figure 4:
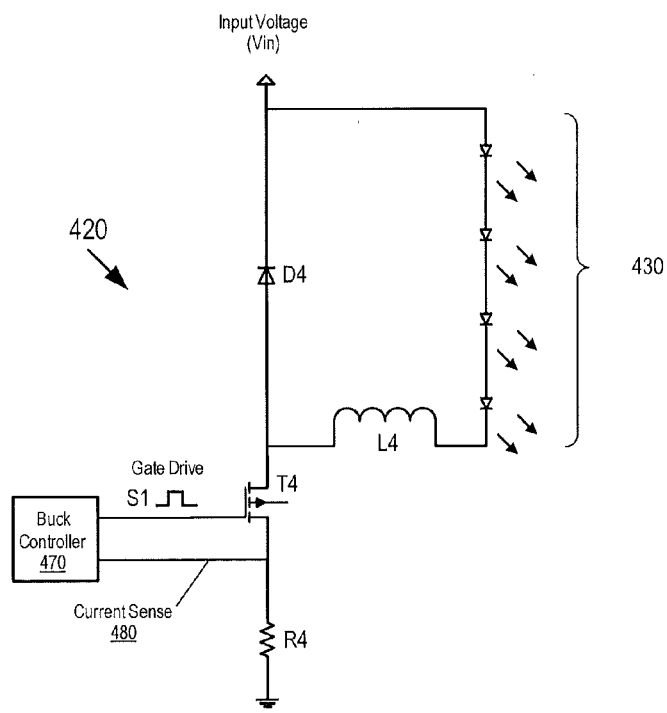
FIG. 4 is a schematic diagram illustrating a buck converter circuit that may be used with fault detection circuits according to some embodiments of the present invention.

FIG. 4 is a schematic diagram illustrating an example of a buck converter circuit 420 in which fault detection circuits according to some embodiments of the present invention may be used. As shown in FIG. 4, a buck converter circuit 420 is used as a current source to drive a load, illustrated by way of example as a string of light emitting diodes (LEDs) 430. In particular, the buck converter circuit 420 includes an inductor L4 as a storage component, a resistor R4, a diode D4, and a FET T4 as a switching device. A buck controller 470 outputs a gate drive signal S1 configured to drive the FET T4 between alternating activated and deactivated states to alternatingly connect the inductor L4 to the input voltage Vin and discharge the inductor L4 into the LED string 430 at the load. The buck controller 470 varies the duty cycle of the gate drive signal S4 in response to a feedback signal 480, illustrated in FIG. 4 as a current sense signal.

Accordingly, in the example of FIG. 4, if the LED string 430 were severed (resulting in an open circuit at the load), the buck controller 470 would increase the duty cycle of the gate drive signal S1 to its maximum duty cycle in an attempt to maintain current in response to the feedback signal 480. The gate drive signal S1 is then output to a fault detection circuit according to some embodiments of the present invention, such as the fault detection circuit 305a of FIG. 3A, which pulls the PGOOD signal 335 to ground in response to detecting the increased duty cycle of the gate drive signal S1 for a predetermined period of time, as discussed in detail above.

Figure 5:
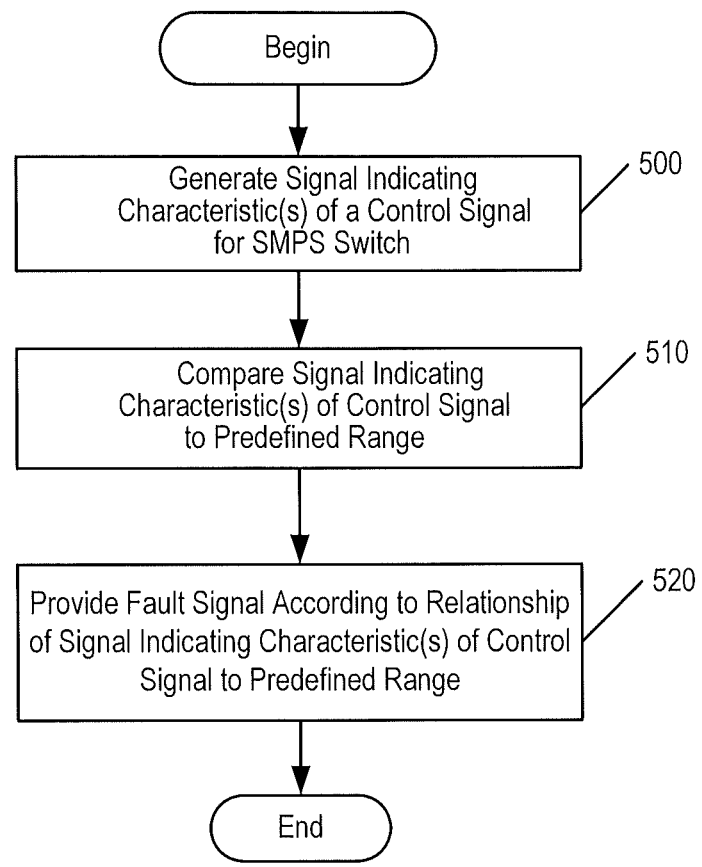
FIGS. 5 and 6 are flowcharts illustrating example operations performed by fault detection circuits according to some embodiments of the present invention.
Figure 6:
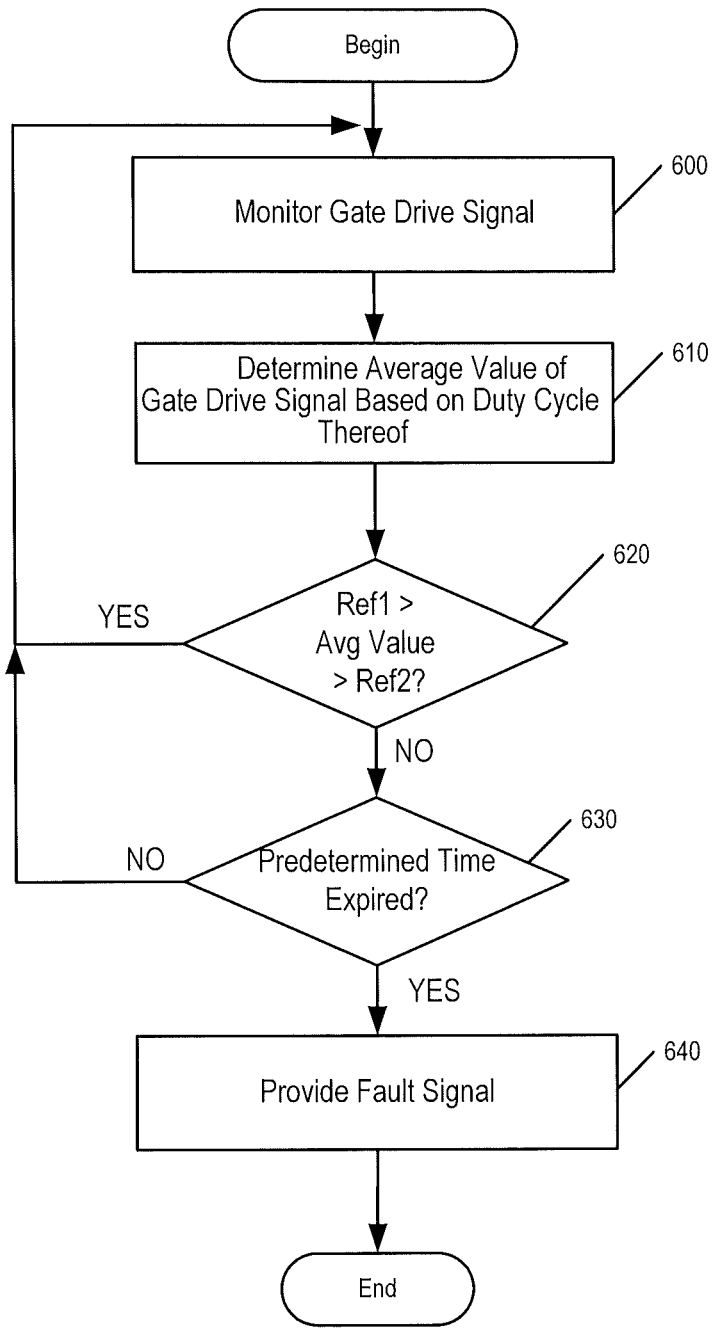

FIGS. 5 and 6 are flowcharts illustrating operations according to some embodiments of the present inventive subject matter. It will be appreciated that the operations illustrated in FIGS. 5 and 6 may be carried out simultaneously or in different sequences without departing from the teachings of the present inventive subject matter. Thus, embodiments of the present inventive subject matter should not be construed as limited to the particular sequence of operations illustrated by the flowcharts. Furthermore, operations illustrated in the flowcharts may be carried out entirely in hardware or in combinations of hardware and software.

Referring now to FIG. 5, a signal indicating characteristics of a control signal for a SMPS switch is generated at Block 500. The control signal is configured to drive at least one switching element of the SMPS between alternating activated and deactivated states to supply power to a load. The signal may indicate a duty cycle of the control signal in some embodiments. The signal indicating the characteristic of the control signal is compared to a range defined by first and second thresholds at Block 510. For example, where the signal indicates the duty cycle of the control signal, the first threshold may represent an upper limit (such as a maximum value) for the duty cycle, while the second threshold may represent a lower limit (such as a minimum value) for the duty cycle. A fault signal is provided according to the relationship of the signal indicative of the characteristic of the control signal and the range defined by the first and second thresholds at Block 520. For instance, the fault signal may be provided when the signal is not within the range defined by the first and second thresholds for a predetermined time period.

FIG. 6 illustrates operations where the control signal is a gate drive signal for a power field effect transistor (FET) of the SMPS. Referring now to FIG. 6, the gate drive signal is continuously monitored at Block 600. An average value of the gate drive signal is determined based on the duty cycle of the gate drive signal at Block 610. The average value of the gate drive signal is compared to a first threshold value Ref1 and to a second threshold value Ref2 at Block 620. More particularly, the average value of the gate drive signal is compared to a range defined between the first and second threshold values Ref1 and Ref2. The first threshold value Ref1 may represent an average value of the gate drive signal at a maximum duty cycle, while the second threshold value Ref2 may represent an average value of the gate drive signal at a minimum duty cycle. For example, the maximum gate drive duty cycle may be about 90% or more, while the minimum gate drive duty cycle may be about 40% or less in some embodiments.

Still referring to FIG. 6, if it is determined at Block 620 that the average value of the gate drive signal is within the range defined between the first and second threshold values Ref1 and Ref2, operations return to monitoring the gate drive signal at Block 600. However, if it is determined at Block 620 that the average value of the gate drive signal falls outside the range defined between the first and second threshold values Ref1 and Ref2, it is determined whether a predetermined time period has expired at Block 630. For example, a counter may be incremented responsive to determination that the average value is outside the range at Block 620, and expiration of the predetermined time period may be determined based on the value of the counter. If it is determined at Block 630 that the predetermined time period has not yet expired, operations return to monitoring the gate drive signal at Block 600. On the other hand, if it is determined at Block 630 that the predetermined time period has expired, a fault signal is provided at Block 640. The predetermined time period may be selected based on the period of the gate drive signal and/or the type of fault to be detected. Accordingly, the fault signal is provided when the average value of the gate drive signal, as computed based on its duty cycle, has fallen outside of the range defined by the first and second thresholds Ref1 and Ref2 for the predetermined time period.

While embodiments of the present invention have been described herein in connection with monitoring the duty cycle of a gate drive signal to determine a fault condition in a power supply, it will be understood that embodiments of the present invention are not so limited. For example, in a SMPS that includes a microprocessor-based gate driver, the microprocessor may determine that the duty cycle of the gate drive signal needs to be altered based on a feedback signal from the load, and may thereby detect the presence of a fault condition according to the determination, e.g., before actually providing the gate drive signal as an output. Also, while described herein with reference to comparing average DC voltage values representative of a duty cycle of a gate drive signal to average DC voltage values representative of maximum and minimum duty cycles, it will be understood that other information that may be ascertained from the duty cycle of the gate drive signal, such as on-time and/or frequency, may be compared with corresponding first and second thresholds to determine the presence of fault conditions.

Embodiments of the present invention may be used in any switched mode power application, and are not limited specifically to those described herein. For example, fault detection circuits according to some embodiments of the present invention may be used in conjunction with current or voltage pulse width modulated power supplies. Also, while described herein with reference to switched mode power supplies that use inductors or transformers, embodiments of the present invention may employ switched-capacitor circuits that have no magnetic storage elements in some embodiments. Such switched-capacitor circuits may be controlled, for example, by the frequency of switching rather than based on the duty cycle of a gate drive signal. Accordingly, while primarily described herein with reference to fault detection based on the duty cycle of a gate drive signal, embodiments of the present invention may generally include fault detection based on any characteristics that can be determined from a control signal used to control switching in a switched mode power supply. Embodiments of the present invention may also be used in linear power supplies and/or other devices that employ a control loop that uses output feedback to generate a control signal.

Embodiments of the present invention may also be used for fault detection in power supplies for driving solid state light sources, such as light emitting diodes (LEDs) used in various applications, including LED lighting systems for general illumination and/or LED backlighting for display technologies. Also, the "PGOOD" signal provided by embodiments of the present invention may be used as an indication as to whether the driven LEDs are functioning correctly without the use of a light sensor.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed exemplary embodiments of the invention, and although specific terms are used, they are used in a generic and descriptive sense only and not for purposes of limitation, the scope of the invention being defined by the following claims.

That which is claimed:

1. A circuit for detecting fault conditions in a supply circuit, the circuit comprising:
    a monitoring circuit operable to output a detection signal related to a control signal for the supply circuit; and
    a comparator circuit operable to compare the detection signal to a range defined by first and second thresholds and output a fault signal indicating a fault condition with respect to the supply circuit according to a relationship of the detection signal to the range over a time period.

2. The circuit of claim 1, wherein the control signal is configured to operate at least one switch of the supply circuit between alternating activated and deactivated states, and wherein the detection signal is indicative of a characteristic of the control signal.

3. The circuit of claim 2, wherein the characteristic of the control signal comprises a duty cycle of the control signal, wherein the first threshold represents an upper limit for the duty cycle, wherein the second threshold represents a lower limit for the duty cycle, and wherein the comparator is operable to output the fault signal when the detection signal is not within the range defined between the first and second thresholds for the time period.

4. The circuit of claim 3, wherein the at least one switch comprises a power transistor, wherein the control signal comprises a gate drive signal for the power transistor, and wherein the monitoring circuit comprises:
    an averaging circuit operable to receive the gate drive signal, determine an average value representing the gate drive signal based on the duty cycle thereof, and output the average value to the comparator circuit as the detection signal.

5. The circuit of claim 4, wherein the first threshold comprises an average value representing the gate drive signal at a maximum duty cycle, and wherein the second threshold comprises an average value representing the gate drive signal at a minimum duty cycle.

6. A circuit for detecting fault conditions in a supply circuit, the circuit comprising:
    a logic circuit operable to receive respective gate drive signals from a plurality of switched mode power supply controllers and operable to output a first signal representing one of the respective gate drive signals having a longest duty cycle and a second signal representing one of the respective gate drive signals having a shortest duty cycle;
    an averaging circuit operable to receive the first and second signals to output a first average value representing the one of the respective gate drive signals having the longest duty cycle, and to output a second average value representing the one of the respective gate drive signals having the shortest duty cycle; and
    a comparator circuit operable to compare the first average value to a first threshold representative of an upper duty cycle limit, to compare the second average value to a second threshold representative of a lower duty cycle limit, and to output the fault signal when the first average value is greater than or equal to the first threshold and/or when the second average value is less than or equal to the second threshold.

7. The circuit of claim 3, wherein the comparator circuit comprises:
    a first comparator operable to compare the detection signal to the first threshold and output the fault signal when the detection signal is greater than or equal to the first threshold; and
    a second comparator operable to compare the detection signal to the second threshold and output the fault signal when the detection signal is less than or equal to the second threshold.

8. The circuit of claim 7, wherein the fault signal comprises a first fault signal indicating an open-circuit condition and a second fault signal indicating a short-circuit condition, wherein the first comparator is operable to output the first fault signal when the detection signal indicative of the duty cycle is greater than or equal to the first threshold, and wherein the second comparator is operable to output the second fault signal when the detection signal indicative of the duty cycle is less than or equal to the second threshold.

9. The circuit of claim 3, wherein the comparator circuit is operable to output a power-good signal indicating that no fault conditions exist when the detection signal indicative of the duty cycle is less than the first threshold and is greater than the second threshold.

10. The circuit of claim 1, wherein the monitoring circuit is operable to output the detection signal responsive to receiving the control signal from a controller of the supply circuit.

11. The circuit of claim 1, wherein the monitoring circuit is operable to output the detection signal responsive to a feedback signal from a load connected to the supply circuit.

12. The circuit of claim 1, further comprising:
a decoupling circuit operable to decouple the supply circuit from a power source in response to the fault signal.

13. A method of detecting fault conditions in a supply circuit, the method comprising:
generating a detection signal related to a control signal for the supply circuit;
comparing the detection signal to a range defined by first and second thresholds; and
providing a fault signal indicating a fault condition with respect to the supply circuit when the detection signal is not within the range defined by the first and second thresholds for a period of time.

14. The method of claim 13, wherein the control signal is configured to drive at least one switching element of the supply circuit between alternating activated and deactivated states to supply power to a load, and wherein the detection signal is indicative of a characteristic of the control signal.

15. The method of claim 14, wherein the characteristic of the control signal comprises a duty cycle of a control signal, an amplitude of the control signal and/or a frequency of the control signal.

16. The method of claim 15, wherein the detection signal indicates a sampled value for the characteristic, an average value for the characteristic, and/or a rate of change for the characteristic, and wherein the range comprises an operating range for the characteristic.

17. The method of claim 14, wherein the at least one switching element comprises a power transistor, wherein the control signal comprises a gate drive signal for the power transistor, and wherein the characteristic of the control signal comprises a duty cycle of the gate drive signal.

18. The method of claim 17, further comprising:
determining an average value representing the gate drive signal based on the duty cycle thereof; and
outputting the average value as the detection signal indicative of the duty cycle of the gate drive signal,
wherein comparing comprises comparing the average value to the first and second thresholds, wherein the first threshold comprises an average value representing the gate drive signal at an upper limit of the duty cycle, and wherein the second threshold comprises an average value representing the gate drive signal at a lower limit of the duty cycle.

19. The method of claim 17, wherein providing the fault signal comprises:
providing a first fault signal indicating an open-circuit condition when the detection signal indicative of the duty cycle of the gate drive signal is greater than or equal to the first threshold; and
providing a second fault signal indicating a short-circuit condition when the detection signal indicative of the duty cycle of the gate drive signal is less than or equal to the second threshold.

20. The method of claim 17, further comprising:
providing a power-good signal indicating that no fault conditions exist when the detection signal indicative of the duty cycle is less than the first threshold and is greater than the second threshold.

21. The method of claim 13, wherein generating the detection signal comprises:
receiving a feedback signal from a load connected to the supply circuit,
wherein generating the detection signal comprises generating the detection signal responsive to receiving the feedback signal.

22. A switched mode power supply, comprising:
at least one switching element operable to be switched between alternating activated and deactivated states to supply power to a load;
a controller circuit operable to output a control signal to the at least one switching element, wherein the control signal is configured to drive the at least one switching element between the alternating activated and deactivated states;
a first circuit coupled to the controller and operable to output a signal indicative of a duty cycle of the control signal; and
a second circuit coupled to the first circuit and operable to compare the signal indicative of the duty cycle of the control signal to a range defined by first and second thresholds and output a fault signal indicating an open-circuit condition or a short-circuit condition when the signal indicative of the duty cycle of the control signal falls outside of the range defined by the first and second thresholds for a predetermined amount of time.

23. The circuit of claim 1, wherein the control signal is independent of the fault signal.

24. The circuit of claim 1, wherein the fault signal indicates an open-circuit condition or a short-circuit condition at the supply circuit.

25. The method of claim 13, wherein the control signal is independent of the fault signal.

26. The method of claim 13, wherein the fault signal indicates an open-circuit condition or a short-circuit condition at the supply circuit.

27. The circuit of claim 1, wherein the detection signal is indicative of a characteristic of the control signal.

28. The method of claim 13, wherein the detection signal is indicative of a characteristic of the control signal.

* * * * *